(12) United States Patent
Martin

(10) Patent No.: US 6,706,972 B1
(45) Date of Patent: Mar. 16, 2004

(54) ELECTRONIC ASSEMBLY COMPRISING A SOLE PLATE FORMING A HEAT SINK

(75) Inventor: Gerard-Marie Martin, Paris (FR)

(73) Assignee: Valeo Electronique, Creteil (FR)

( * ) Notice: Subject to any disclaimer, the term of this patent is extended or adjusted under 35 U.S.C. 154(b) by 0 days.

(21) Appl. No.: 09/806,062

(22) PCT Filed: Jul. 21, 2000

(86) PCT No.: PCT/FR00/02098

§ 371 (c)(1),
(2), (4) Date: Jun. 25, 2001

(87) PCT Pub. No.: WO01/08459

PCT Pub. Date: Feb. 1, 2001

(30) Foreign Application Priority Data

Jul. 23, 1999 (FR) .............................. 99 09701

(51) Int. Cl.⁷ .................................. H05K 1/16
(52) U.S. Cl. .................. 174/260; 174/252; 174/262; 361/709; 361/719; 361/760
(58) Field of Search ................. 174/252, 260; 361/719, 720, 760; 257/711, 712, 720

(56) References Cited

U.S. PATENT DOCUMENTS

| | | | | |
|---|---|---|---|---|
| 4,396,936 A | * | 8/1983 | McIver et al. | 174/252 |
| 5,014,904 A | * | 5/1991 | Morton | 228/176 |
| 5,172,301 A | * | 12/1992 | Schneider | 361/717 |
| 5,646,826 A | * | 7/1997 | Katchmar | 361/704 |
| 5,661,902 A | | 9/1997 | Katchmar | |
| 5,790,379 A | * | 8/1998 | Kang | 361/719 |
| 6,115,255 A | * | 9/2000 | Iovdalsky | 361/705 |
| 6,156,980 A | * | 12/2000 | Peugh et al. | 174/252 |
| 6,349,033 B1 | * | 2/2002 | Dubin et al. | 361/704 |

FOREIGN PATENT DOCUMENTS

| | | |
|---|---|---|
| DE | 4335525 A1 | 4/1995 |
| DE | 19601649 A1 | 7/1997 |

* cited by examiner

Primary Examiner—Evan Pert
Assistant Examiner—J B Patel
(74) Attorney, Agent, or Firm—Oliff & Berridge, PLC

(57) ABSTRACT

The invention concerns an assembly supported on a base plate forming a radiator or capable of being directly mounted on the base plate, comprising a printed circuit card (1) having its thickness a plurality of holes (5) ensuring heat transfer between one face of said printed circuit card (1), which bears one or several electronic components (2) each enclosed by a box, and a base plate (3). The base plate forms a radiator having a plurality of pads (4a) made of heat conducting material and which run through the printed circuit card (1) over substantially its whole thickness to ensure heat transfer between a face of the printed circuit card (1) and the base plate. The pads (4a) are integral with a sole plate (4) which bears them. The sole plate (4) is interposed between the printed circuit card (1) and the base plate.

8 Claims, 2 Drawing Sheets

ELECTRONIC ASSEMBLY COMPRISING A SOLE PLATE FORMING A HEAT SINK

The present invention relates to an assembly of the type comprising a printed circuit card and a sole plate forming a heat sink, which are arranged on a base forming a radiator.

In an assembly of this type, the printed circuit card is conventionally a double-sided card which has metallized holes TM, as illustrated in FIG. 1.

These metallized holes TM constitute what are called "thermal vias" which, in addition to the electrical interconnection between the two sides of the substrate, allow heat to be transferred between the bass and the heat-dissipating components with which the card is equipped.

However, the amount of heat which these holes can transfer is small. The reason for this is that, even though the thermal conductivity of copper is about 1000 times higher than that of the epoxy materials used to produce the substrates of the printed circuit cards, the thickness of the copper layers deposited on the walls of the holes which pass through the substrates is very small (of the order of 30 μm) so that little heat is transferred.

In an assembly of one or more components on a printed circuit card having thermal vias, the document U.S. Pat. No. 5,646,826 proposes to increase the heat-transfer capacity of these holes by injecting into them a material whose thermal dissipation properties are superior to those of the printed circuit card forming the substrate. Injection solutions of this type are generally expensive and require the use of specific and elaborate tools.

In an assembly of one or more components on a printed circuit card, the document DE-A-196 01 649 proposes to replace some of the printed circuit card by a bulk metal part which is more conductive than the printed circuit card. Using a bulk metal part causes problems with the flatness of the assembly and subjects the printed circuit card to significant lateral stresses.

The solutions employed in the prior art have a number of drawbacks which need to be resolved.

It is therefore an object of the invention to provide an assembly with a heat sink which allows better heat transfer between the metal base of the boxes of the power components supported by the printed circuit card and the base, by means of a heat sink which permits better cooling or better thermal dissipation for the electronic card.

To that end, the invention proposes an assembly supported on a base forming a radiator or capable of being mounted on such a base, comprising a printed circuit card which has in its thickness a plurality of a holes intended to transfer heat between one face of the said printed circuit card, which supports one or more electronic components each enclosed by a box, and the base forming a radiator, having a plurality of pads a which are made of a thermally conductive material and pass through the printed circuit card over substantially its whole thickness while being housed by the holes therein, in order to transfer heat between one face of the printed circuit card, which supports one or more components, and the base, the pads (4a) are integral with a plate (4), referred to as the sole plate, which supports them, characterized in that the sole plate (4) is interposed between the printed circuit card (1) and the base.

The invention is advantageously supplemented by the various characteristics below, taken individually or in any of their feasible combinations:

the sole plate is made of the same material as the bottom of the component box or of a material with equivalent coefficient of expansion and/or thermal conductivity;

the assembly has a ductile thermal joint through which it is in contact with the base;

pads are directly supported by the box of electronic components and are in contact with the base through a ductile thermal joint;

the sole plate has complementary means capable of mechanically holding it to the card;

the complementary holding means are spikes which are supported by the sole plate;

the sole plate (4) and the pads (4a) are soldered to the card in order to spread the thermal dissipation;

the sole plate has through-holes for discharging the residual air possibly trapped in the solder.

Other characteristics and advantages of the invention will become more apparent from the description below, which is purely illustrative and is does not imply any limitation, and should be read with reference to the appended drawings, in which:

FIG. 1 which has already been analysed, illustrates a printed circuit card structure having holes (metallized or non-metallized) according to an embodiment which is known from the prior are;

Figure 1:
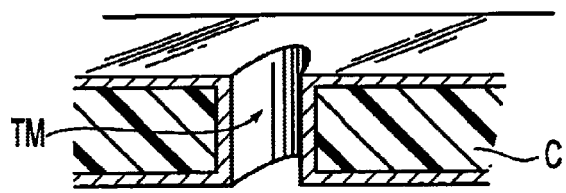
Figure 2:
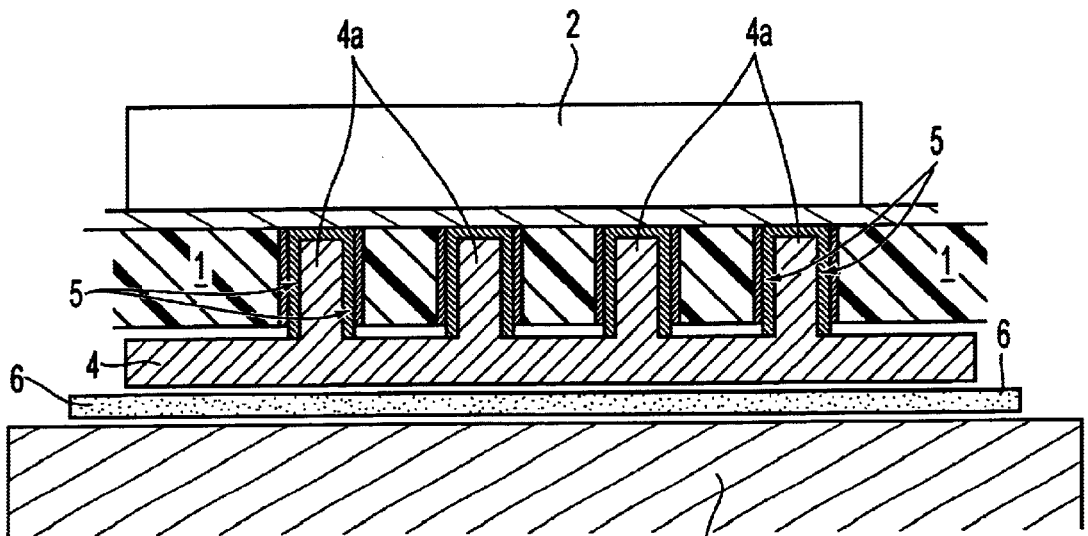
FIG. 2 is a diagrammatic sectional representation of an assembly according to a possible embodiment of the invention.

The assembly illustrated in FIG. 2 comprises a printed circuit card 1 equipped with one or more boxes of surface-mount electronic components 2. These component boxes have a metal base at their bottom adjacent to the printed circuit card. The assembly also comprises a part 3, namely a base forming a radiator which is intended to dissipate the heat generated by the card 1 and the component or components 2.

A sole plate 4 made of a highly conductive material is interposed between the card 1 and the base forming the radiator.

This sole plate 4 has a plurality of pads 4a which project from its face directly adjacent to the card 1 and pass through the said card 1 over substantially its whole thickness via through-orifices 5 therein.

Here, and throughout the present text, the term "pads" is intended to mean elements which are independent of the card 1 and which, in particular, are distinct from any metallized layer which this card 1 may have, in particular in its through-orifices S.

The sole plate 4 is preferably made of the same material as the base of the bottom of the box of a component 2, or of a material whose coefficient of thermal expansion and/or thermal conductivity are similar to those of the base of the bottom of the box. For instance, the sole plate in preferably made of copper.

In order to promote the contact between the sole plate 4 and the base 3, a ductile thermal joint 6 is Inserted between these two parts. This joint enhances the thermal dissipation.

The box or boxes of SMD components 2 are, for example, welded to the card 1 and the ends of the pads 4a by soldering. The sole plate 4 may also be welded to the printed circuit card 1 by soldering.

This soldering operation may be carried out directly in a single step but, for reasons of handling the parts during production of the assembly, it may be desirable to carry out the soldering in two steps. For instance, the sole plate 4 is firstly welded to the printed circuit card 1 by soldering, then the box or boxes of components 2 are welded to the printed circuit card 1 by soldering.

The sole plate 4 and the pads 4a are welded to the printed circuit card in order to obtain greater thermal dissipation. To explain: increasing the contact by means of the solder optimizes the transfer of energy to the base 3 and spreads the thermal dissipation in the best way. Nevertheless, an adhesive bonding process could alternatively be used to produce these assemblies.

The base 3 forming the radiator is, for example, an aluminium part covered with a layer of electrical insulator.

With such a structure, the quantity of material which conducts heat through the substrate of the card 1 is greatly increased. The heat transfer is therefore enhanced very significantly between the upper face of the card 1 and the base 3 forming the radiator.

Of course, the pads 4a are preferably solid elements so as to ensure the greatest possible thermal transfer.

This solution advantageously allows the sole plate 4 to be regarded as an entirely separate "component" which is fitted in place when the assembly according to the invention is being produced.

The diameter of the metallized or non-metallized holes TM made in the printed circuit card 1 in between 0.4 and 1 mm on average. It is then possible, knowing the size of the power component boxes, approximately to estimate the number of pads present under each component box. The number of pads present under each component box varies between 10 and 20 depending on the size of the component box. This is a large number of pads, which in fact allows a significant improvement to the thermal dissipation of the heat produced by the power component.

Figure 3:
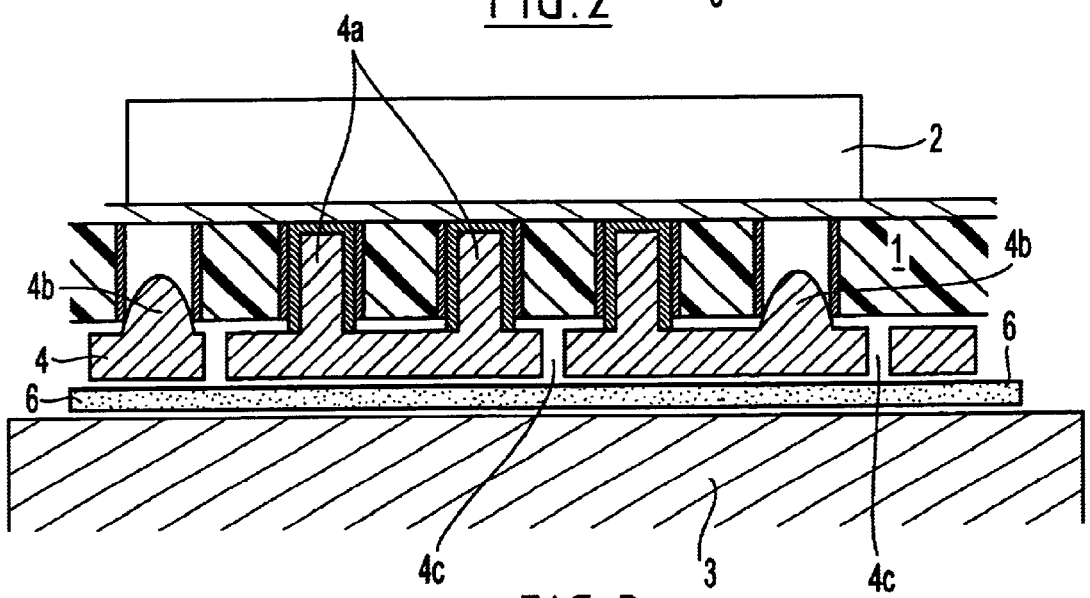
FIG. 3 is a diagrammatic sectional representation of an assembly according to a possible embodiment of the invention, incorporating holding means between the sole plate and the printed circuit card.

FIG. 3 presents an assembly according to the invention provided with an example of complementary means for holding the sole plate 4 on the printed circuit card 1.

In addition to the pads 4a, the sole plate 4 comprises means which hold it mechanically with respect to the printed circuit card 1. These complementary means are, for example, elastic locking means (clips) or force-fit spike's.

FIG. 3 presents a sole plate 4 comprising spikes 4b of conical general shape, in order to permit force-fitting of the spikes 4b into holes made in the printed circuit card 1, so as to hold the printed circuit card 1 with respect to the sole plate 4 regardless of the way in which the assembly is handled.

The sole plate 4 also has through-holes 4c at certain positions, to discharge the residual air which might remain trapped in the solder under the power component.

The card 1, the sole plate 4 and the base 3 forming the radiator are then assembled by cold pressing or crimping, or by any other technique (screwing, pressure spring) which mechanically secures the assembly. This assembly might advantageously be produced on a structured base which has two levels, one being set back further to receive the sole plate 4, and the other being leas deep and having a thickness equal to that of the sole plate 4 on which the printed circuit rests, and onto which level the assembly is crimped.

The assembly according to the invention makes it possible to accommodate the expansion conditions of the various elements relative to one another, and ensures that the assembly is flat by virtue of the presence of a reference surface on the sole plate (4).

As a variant, one or more thermal pad may be supported directly by the SMD components 2, instead of being supported by an independent metal sole plate.

Figure 4A:
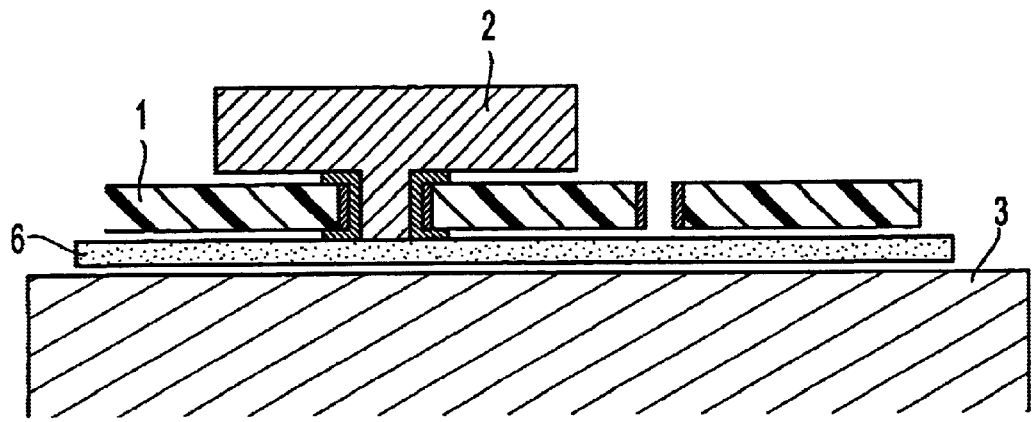
FIGS. 4a and 4b are diagrammatic sectional representations of an assembly according to another possible embodiment of the invention.
Figure 4B:
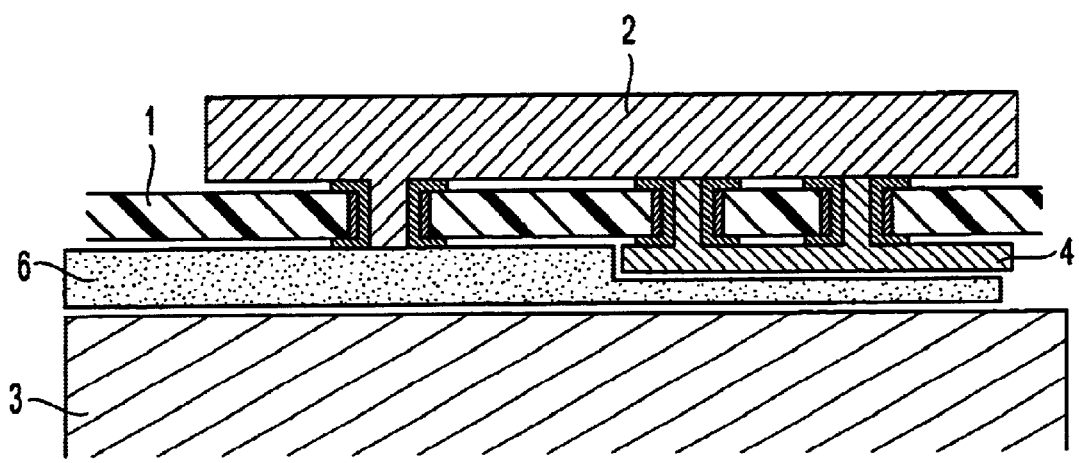

This is what FIGS. 4a and 4b illustrate.

The printed circuit card 1 is mounted on the base 3 by means of a thermal ductile joint 6 and supports the components 2 on its face remote from the joint 6 and the base 3.

In this configuration, the ductile thermal joint 6 is interposed between the card 1 and the base 3, one or more pads supported by the components 2 being in contact with the base 3 through the said thermal joint 6.

It is further possible to improve the thermal dissipation by combining the use of a box of components 2 having pads and a sale plate 4 having pads 4a, as FIG. 4b shows.

I claim:

1. An assembly comprising:

a base forming a radiator;

a printed circuit card having a first face which supports at least one box enclosing at least one electronic component and having a box base adjacent to the first face, a sole plate interposed between a second face of the printed circuit card and the radiator base, plurality of pads integral with the sole plate, said pads being made of a thermally conductive material and being housed in holes, made in the printed circuit card, in order to pass through the printed circuit card over substantially its whole thickness, wherein the sole plate is made of a same material or one with a similar coefficient of expansion and/or thermal conductivity as the base of the box and wherein the box enclosing at least one electronic component and the plurality of pads are soldered to the printed circuit card, in order to solder the box enclosing at least one electronic component to the plurality of pads.

2. The assembly according to claim 1, comprising a ductile thermal joint through which it is in contact with the base.

3. The assembly according to claim 1, wherein the sole plate has complimentary means capable of mechanically holding it to the card.

4. The assembly according to claim 3, wherein the complimentary holding means are spikes which are supported by the sole plate and are force-fitted into holes in the printed circuit card.

5. The assembly according to claim 1, wherein the sole plate is soldered to the printed circuit card.

6. The assembly according to claim 5, wherein the sole plate has through-holes for discharging residual air possibly trapped in the solder.

7. The assembly according to claim 1, wherein the box is a box enclosing at least one surface-mount electronic power component.

8. An assembly comprising:

a base forming a radiator, a printed circuit card having a first face which supports at least one box enclosing at least one electronic component and having a box base adjacent to the first face, a sole plate interposed between a second face of the printed circuit card and the radiator base, a plurality of pads integral with the sole plate, said pads being made of a thermally conductive material and being housed in holes, made in the printed card, in order to pass through the printed circuit card over substantially its whole thickness, wherein the diameter of the holes is between 0.4 and 1 mm on average, wherein the sole plate is made of a same material or one with a similar coefficient of expansion and/or thermal conductivity as the base of the box, and wherein the box of electronic component and the pads are soldered to the printed circuit card.

* * * * *